United States Patent
Hamaguchi

(10) Patent No.: US 7,570,119 B2
(45) Date of Patent: Aug. 4, 2009

(54) CASCODE-CONNECTED AMPLIFIER CIRCUIT, SEMICONDUCTOR INTEGRATED CIRCUIT USING SAME, AND RECEIVING APPARATUS USING SAME

(75) Inventor: Mutsumi Hamaguchi, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 97 days.

(21) Appl. No.: 11/717,724

(22) Filed: Mar. 14, 2007

(65) Prior Publication Data

US 2007/0296507 A1    Dec. 27, 2007

(30) Foreign Application Priority Data

Jun. 21, 2006    (JP) .............................. 2006-171803

(51) Int. Cl.
  *H03F 3/04* (2006.01)
(52) U.S. Cl. ....................................... 330/311; 330/310
(58) Field of Classification Search ................. 330/311, 330/310
  See application file for complete search history.

(56) References Cited

U.S. PATENT DOCUMENTS

| | | | | |
|---|---|---|---|---|
| 4,587,495 | A * | 5/1986 | Osawa et al. ................. | 330/311 |
| 5,304,946 | A * | 4/1994 | Sano et al. ................... | 330/254 |
| 6,342,816 | B1 * | 1/2002 | Gradzki ....................... | 330/311 |
| 6,690,239 | B2 * | 2/2004 | Wilson et al. ............... | 330/308 |
| 7,019,593 | B2 * | 3/2006 | Krishnasamy Maniam et al. .......................... | 330/302 |
| 7,154,340 | B2 * | 12/2006 | Joodaki et al. .............. | 330/311 |
| 7,199,670 | B2 * | 4/2007 | Behzad ....................... | 330/311 |
| 7,323,937 | B2 * | 1/2008 | Ooya et al. .................. | 330/295 |
| 2006/0033575 | A1 | 2/2006 | Ooya et al. | |

FOREIGN PATENT DOCUMENTS

| | | |
|---|---|---|
| JP | 2-253707 A | 10/1990 |
| JP | 6-23320 U | 3/1994 |
| JP | 10-75126 A | 3/1998 |
| JP | 10-308634 A | 11/1998 |
| JP | 2000-132907 A | 5/2000 |
| JP | 2001-102877 A | 4/2001 |
| JP | 2004-112299 A | 4/2004 |
| JP | 2005-197415 A | 7/2005 |
| JP | 2005-312016 A | 11/2005 |
| JP | 2006-50074 A | 2/2006 |

* cited by examiner

*Primary Examiner*—Henry K Choe
(74) *Attorney, Agent, or Firm*—Birch, Stewart, Kolasch & Birch, LLP

(57) ABSTRACT

A cascode-connected amplifier circuit including two transistors cascode-connected to each other, where a first transistor having a grounded emitter or a first field-effect transistor having a grounded source, and (a) a second transistor, having a grounded base, which is cascode-connected to the first transistor or to the first field-effect transistor, or (b) a second field-effect transistor, having a grounded gate, which is cascode-connected to the first transistor or to the first field-effect transistor. The cascode-connected amplifier circuit includes a switching element causing a collector of the first transistor or a drain of the first field-effect transistor to be grounded.

13 Claims, 13 Drawing Sheets

CASCODE-CONNECTED AMPLIFIER CIRCUIT, SEMICONDUCTOR INTEGRATED CIRCUIT USING SAME, AND RECEIVING APPARATUS USING SAME

This Nonprovisional application claims priority under 35 U.S.C. § 119(a) on Patent Application No. 171803/2006 filed in Japan on Jun. 21, 2006, the entire contents of which are hereby incorporated by reference.

FIELD OF THE INVENTION

The present invention relates to (i) a cascode-connected amplifier circuit including a series connection (hereinafter referred to as "cascode connection") of a plurality of transistors and (ii) a communication apparatus (e.g., a communication terminal) using the amplifier circuit.

BACKGROUND OF THE INVENTION

Conventionally, a cascode-connected amplifier circuit, which has better high-frequency characteristics than does a grounded-emitter amplifier circuit, has been used in an amplifier circuit and a gain-variable amplifier circuit.

The input impedance of the grounded-emitter amplifier circuit can be considered to be equal to a value obtained when a base-collector resistor Rbc and a base-collector capacitor Cbc are connected in parallel to a base-emitter capacitor Cbe.

The capacitance of the base-collector capacitor Cbc is multiplied by (Av+1) due to the mirror effect, where Av is the amplification degree of a grounded-emitter transistor used in the grounded-emitter amplifier circuit, so that the capacitive component of the input impedance is increased. This causes deterioration of the high-frequency characteristics of the grounded-emitter amplifier circuit. On the other hand, in the cascode-connected amplifier circuit, the amplification degree Av becomes 0, so that there is no influence from the mirror effect. This makes it possible to obtain good frequency characteristics.

FIG. 14 is a circuit diagram showing an arrangement of a conventional cascode-connected amplifier circuit as shown in Japanese Unexamined Patent Publication No. 308634/1998 (Tokukaihei 10-308634; published on Nov. 17, 1998).

As shown in FIG. 14, a cascode-connected amplifier circuit 200 includes a cascode connection of a grounded-emitter bipolar transistor Q201 and a grounded-gate MOS transistor M202, and is arranged such that a voltage inputted to a base of the transistor Q201 is outputted from a drain of the MOS transistor M202.

Further, a gate of the MOS transistor M202 is connected to a bias power supply V202, and a power supply voltage Vcc is applied to the drain of the MOS transistor M202 via a load resistor R202.

Gain to be obtained by the cascode-connected amplifier circuit 200 is adjusted in the following manner: The amount of current flowing through the base of the transistor Q201 is changed, and the amount of collector current is changed in accordance with the change of the amount of the base current. Therefore, amplification operation of the cascode-connected amplifier circuit 200 can be stopped by reducing, in order that the base-emitter voltage of the transistor Q201 is less than a transistor's threshold voltage, the amount of the current flowing through the base of the transistor Q201.

Specifically, when the transistor Q201 is switched off, the potential of a collector of the transistor Q201 is increased. Moreover, the collector of the transistor Q201 is connected to a source of the MOS transistor M202, so that the collector of the transistor Q201 and the source of the MOS transistor M202 have the same potential.

Therefore, when the transistor Q201 is switched off, the potential of the source of the MOS transistor M202 is increased. Accordingly, the gate-source voltage of the MOS transistor 202 becomes less than a transistor's threshold voltage. Therefore, the MOS transistor M202 is switched off.

However, in the cascode-connected amplifier circuit 200, in cases where an input terminal of the transistor Q201 receives a large signal, the electric power of the signal causes the transistor Q201 to be temporarily on, so that the potential of the collector of the transistor Q201 is reduced. Accordingly, the gate-source voltage of the MOS transistor M202 becomes not less than a transistor's threshold voltage. Therefore, the MOS transistor M202 is switched on. This raises such a problem that: the cascode-connected amplifier circuit 200 is temporarily on when it is supposed to be off, so that sufficient isolation is not attained.

Further, for example, see a case of a gain-variable amplifier circuit including a plurality of cascode-connected amplifier circuits 200. In this case, even when operation of a transistor of a first cascode-connected amplifier circuit stage is stopped so that operation of the first cascode-connected amplifier circuit stage is stopped, a voltage is always applied to a gate of a MOS transistor of the first cascode-connected amplifier circuit stage. This may affect an operational state of a second cascode-connected amplifier circuit stage. The same holds true in cases where the first cascode-connected amplifier circuit stage is in an operating state and the second cascode-connected amplifier circuit stage is in a nonoperating state. Therefore, signal leakage occurs at each amplifier stage. This raises such a problem that gain suppression and linearity are deteriorated.

In order to solve such problems, a cascode-connected amplifier circuit disclosed, for example, in Japanese Unexamined Patent Publication No. 312016/2005 (Tokukai 2005-312016; published on Nov. 4, 2005) includes a bipolar transistor and/or a field-effect transistor, and a base or gate of each of the transistors is provided with a control circuit.

However, even when a grounded-emitter bipolar transistor is off, the cascode-connected amplifier circuit may suffer from the following problem: In cases where a control voltage to be applied to a base of the bipolar transistor (or to a gate of a grounded-source field-effect transistor) cannot be sufficiently reduced, or in cases where the base current of a grounded-base bipolar transistor or the gate voltage of a grounded-gate field-effect transistor cannot be sufficiently reduced, the bipolar transistor (or the field-effect transistor) is switched on for operation.

SUMMARY OF THE INVENTION

The present invention has been made in view of the foregoing problems, and it is an object of the present invention to realize a cascode-connected amplifier circuit which makes it possible that: an improvement in isolation is made so that operation of the cascode-connected amplifier circuit is surely stopped by simple means.

In order to solve the foregoing problems, a cascode-connected amplifier circuit includes: a first transistor having a grounded emitter or a first field-effect transistor having a grounded source; (a) a second transistor, having a grounded base, which is cascode-connected to the first transistor or to the first field-effect transistor, or (b) a second field-effect transistor, having a grounded gate, which is cascode-connected to the first transistor or to the first field-effect transistor; and selecting means for causing a collector of the first transistor or a drain of the first field-effect transistor to be grounded.

According to the foregoing arrangement, in cases where the collector of the first transistor having the grounded emitter is grounded by the selecting means, the collector and emitter of the first transistor have the same potential. Therefore, no current flows between the collector and emitter of the first transistor. Alternatively, in cases where the drain of the first field-effect transistor having the grounded source is grounded by the selecting means, the drain and source of the first field-effect transistor have the same potential. Therefore, no current flows between the drain and source of the first field-effect transistor.

With this, operation of the cascode-connected amplifier circuit can be surely stopped even in cases where the first transistor is undesirably operated under the influence of (i) a voltage applied to the base of the first transistor or (ii) the like, or in cases where the first field-effect transistor is undesirably operated under the influence of (a) a voltage applied to the gate of the first field-effect transistor or (b) the like. This makes it possible to improve isolation.

Additional objects, features, and strengths of the present invention will be made clear by the description below. Further, the advantages of the present invention will be evident from the following explanation in reference to the drawings.

DESCRIPTION OF THE EMBODIMENTS

Embodiment 1

An embodiment of the present invention will be described below with reference to FIGS. 1 through 6.

Figure 1:
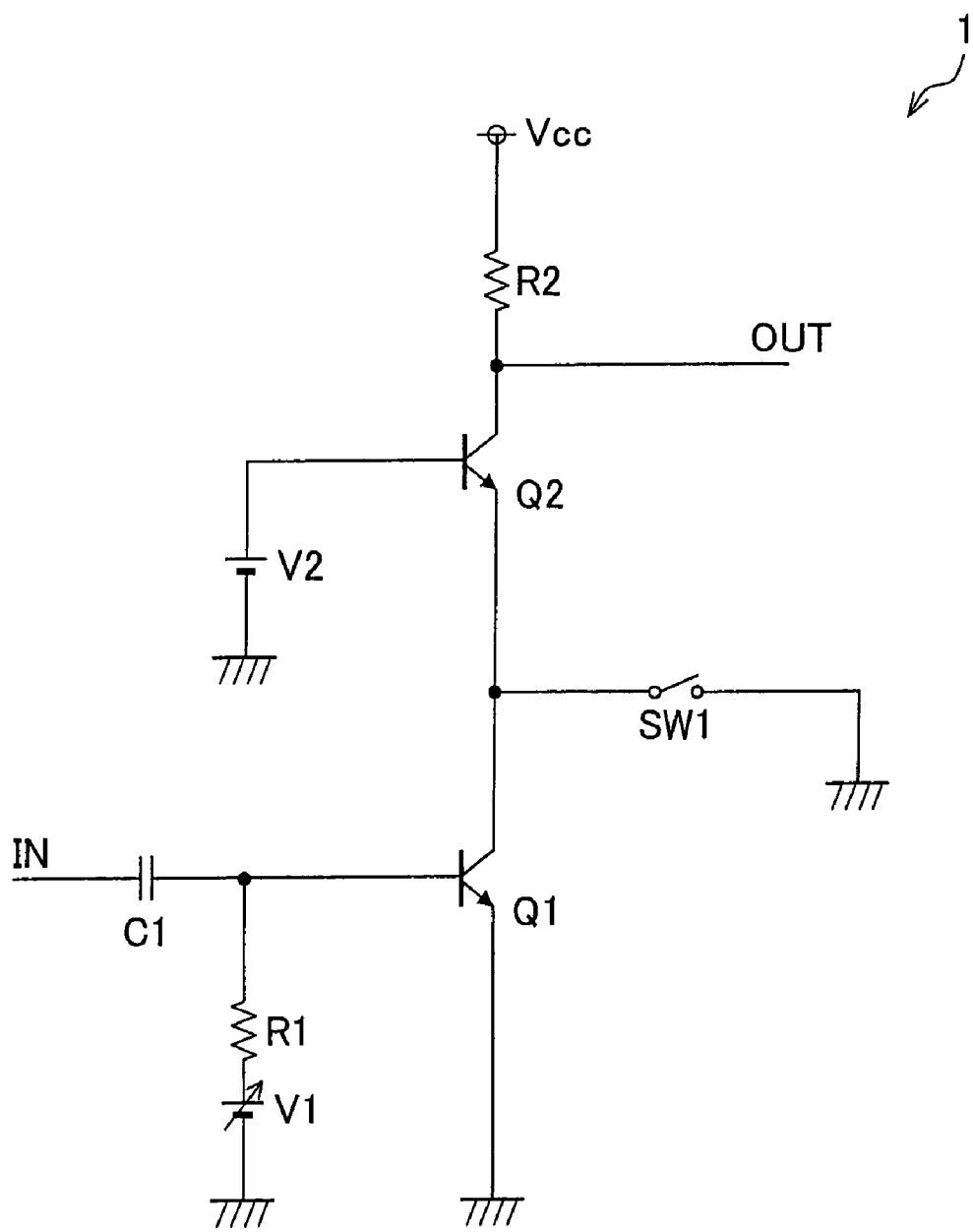
FIG. 1 shows Embodiment 1 of the present invention, and is a circuit diagram showing an arrangement of a cascode-connected amplifier circuit.
Figure 2:
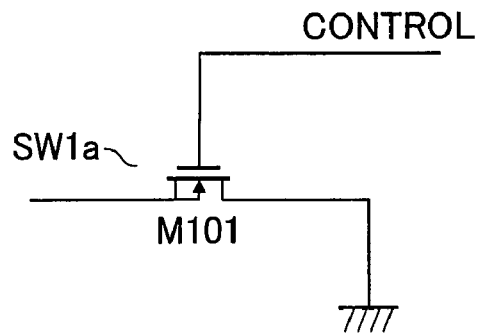
FIG. 2(a) is a circuit diagram showing an arrangement of a switching element provided in the cascode-connected amplifier circuit shown in FIG. 1.
FIG. 2(b) is a circuit diagram showing another arrangement of the switching element provided in the cascode-connected amplifier circuit shown in FIG. 1.
FIG. 2(c) is a circuit diagram showing another arrangement of the switching element provided in the cascode-connected amplifier circuit shown in FIG. 1.
Figure 2:
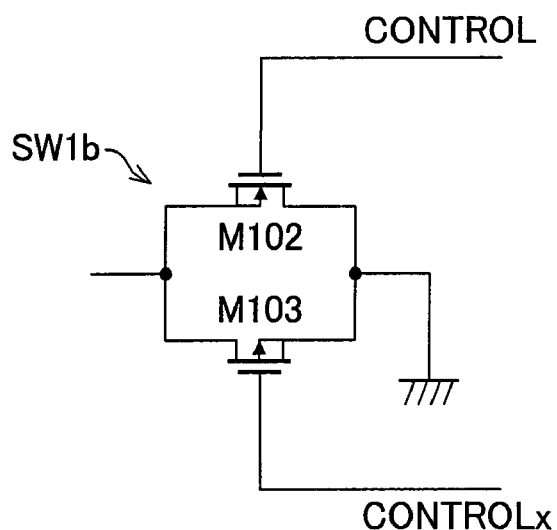
Figure 2:
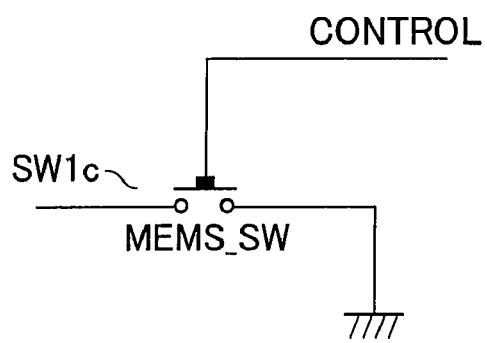

FIG. 1 is a circuit diagram showing an arrangement of a cascode-connected amplifier circuit 1 according to the present embodiment. The cascode-connected amplifier circuit 1 according to the present embodiment includes a grounded-emitter bipolar transistor (first transistor) Q1, a grounded-base bipolar transistor (second transistor) Q2, base voltage power supplies V1 and V2, a bias resistor R1, a load resistor R2, and a coupling capacitor C1.

A signal received by the cascode-connected amplifier circuit 1 is inputted to a base of the transistor Q1 via the coupling capacitor C1, and the coupling capacitor C1 impedes a DC component of the input signal. Further, the base voltage power supply (second voltage control means) V1 is connected to the base of the transistor Q1 via the bias resistor R1. The base voltage power supply V1 is a variable-voltage power supply, and controls the base current of the transistor Q1. Thus, the gain of the cascode-connected amplifier circuit 1 is controlled.

Further, the base voltage power supply V2, which functions as a bias power supply, is connected to a base of the transistor Q2. Further, the transistor Q2 has a collector to which a power supply voltage Vcc is applied via the load resistor R2. The load resistor R2 converts the collector current of the transistor Q2 into a voltage, and the voltage thus obtained is outputted as a voltage signal from the collector of the transistor Q2.

Furthermore, the transistor Q1 has a collector connected to an emitter of the transistor Q2. Therefore, the signal inputted to the base of the transistor Q1 is amplified or attenuated, and then is outputted from the collector of the transistor Q2 to a following circuit stage.

Further, the cascode-connected amplifier circuit 1 includes a switching element (selecting means) SW1. The switching element SW1 has a terminal connected to the collector of the transistor Q1, and the other terminal of the switching element SW1 is grounded. Further, the switching element SW1 has a control terminal to which a control signal is supplied. Note that control of the switching element SW1 will be fully described later.

When the switching element SW1 is switched on, the collector of the transistor Q1 is grounded, so that the emitter and collector of the transistor Q1 have the same potential. For this reason, no current flows between the emitter and collector of the transistor Q1. Thus, operation of the cascode-connected amplifier circuit 1 can be stopped by controlling the switching element SW1.

This makes it possible that: regardless of the size of a control voltage to be applied to the base of the transistor Q1, i.e., even when the control voltage cannot be sufficiently reduced, the operation of the cascode-connected amplifier circuit 1 is surely stopped simply by switching on the switching element SW1. This makes it possible to improve isolation.

The cascode-connected amplifier circuit 1 is off when the switching element SW1 is on, so that the cascode-connected amplifier circuit 1 does not output the signal received by the transistor Q1. This makes it unnecessary to apply a base voltage to the transistor Q1. Therefore, it is preferable that the base voltage of the transistor Q1 be held down with the use of the base voltage power supply V1 when the switching element SW1 is on. Further, by holding down the base voltage of the transistor Q1, it is possible to prevent such a reverse-bias phenomenon that the base voltage of the transistor Q1 becomes sufficiently higher than the collector voltage of the transistor Q1.

Further, in cases where the collector voltage of the transistor Q1 is low, the switching element SW1 may be replaced, as shown in FIG. 2(a), by a MOS switch SW1a constituted by a MOS transistor. Further, as shown in FIG. 2(b), in cases where the collector voltage of the transistor Q2 is high, a CMOS switch SW1b constituted by a CMOS transistor may be used. Note that the CMOS transistor is constituted by an NMOS transistor M102 and a PMOS transistor M103. The PMOS transistor M103 has a control terminal receiving a control signal CONTROLx obtained by inverting a control signal CONTROL. Furthermore, in cases where each of the MOS switch SW1a and the CMOS switch SW1b has a high on-resistance and thus has a great insertion loss, a MEMS (microelectromechanical system) switch SW1c may be used as shown in FIG. 2(c).

Figure 3:
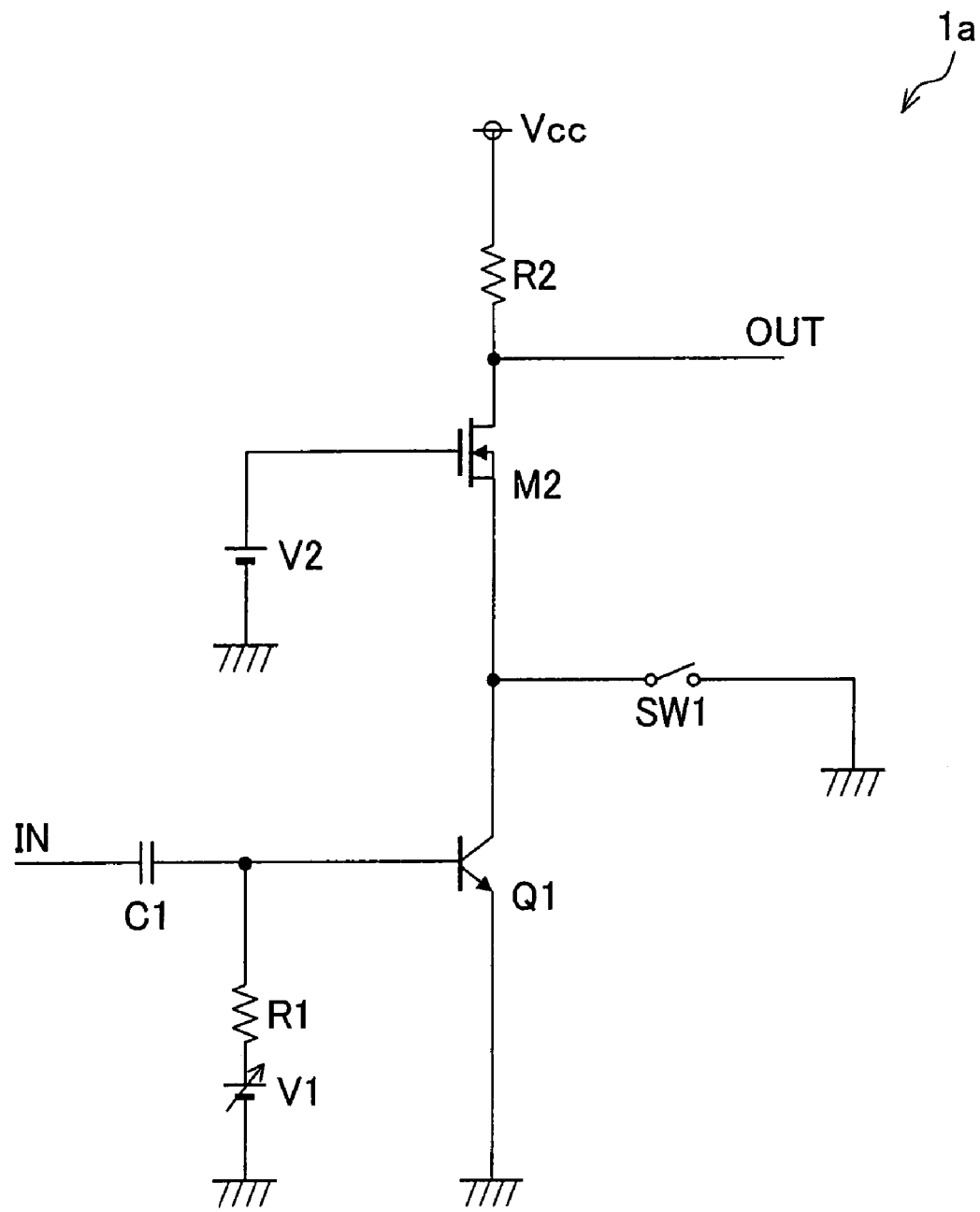
FIG. 3 is a circuit diagram showing a modified example of the arrangement of the cascode-connected amplifier circuit shown in FIG. 1.
Figure 4:
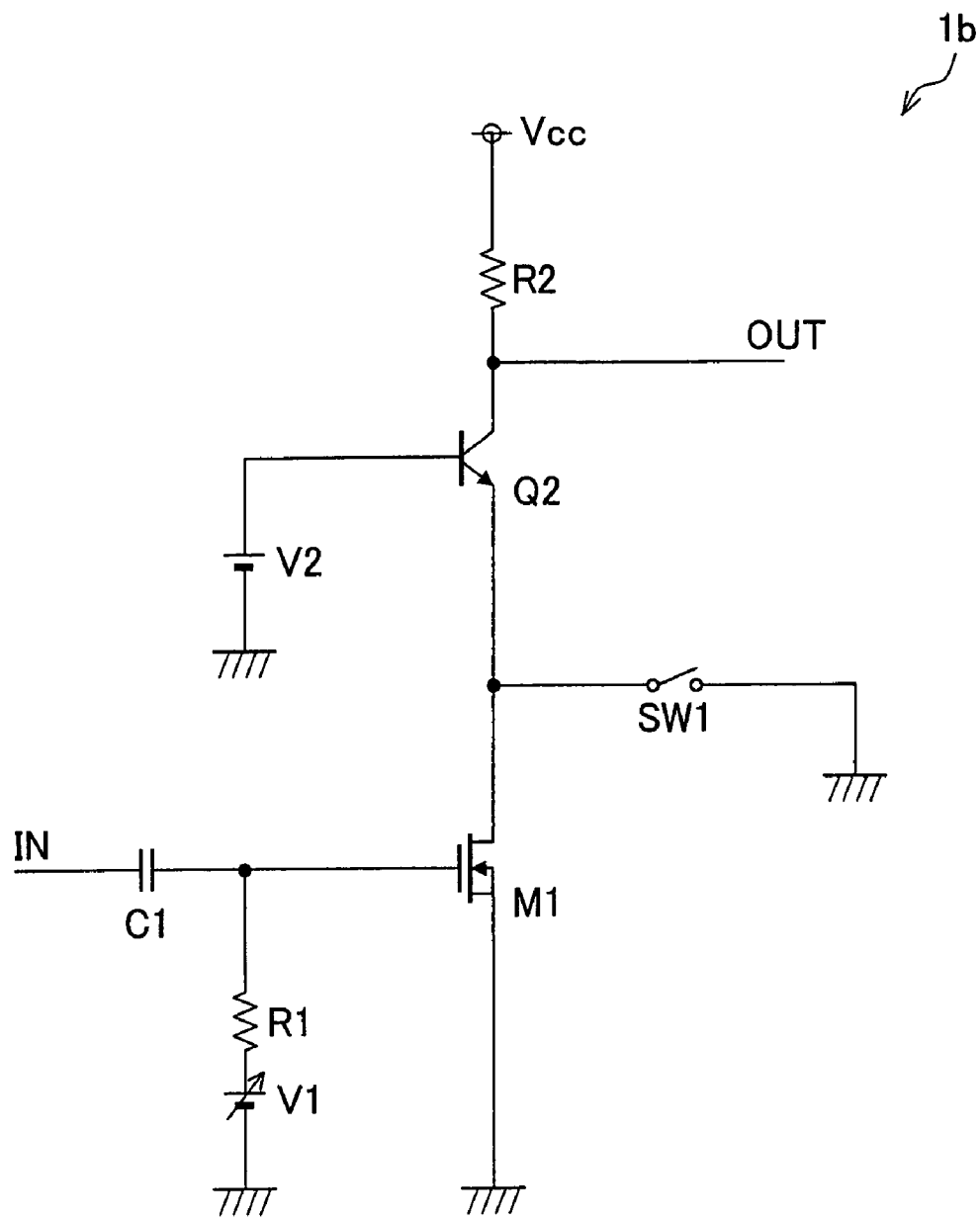
FIG. 4 is a circuit diagram showing another modified example of the arrangement of the cascode-connected amplifier circuit shown in FIG. 1.
Figure 5:
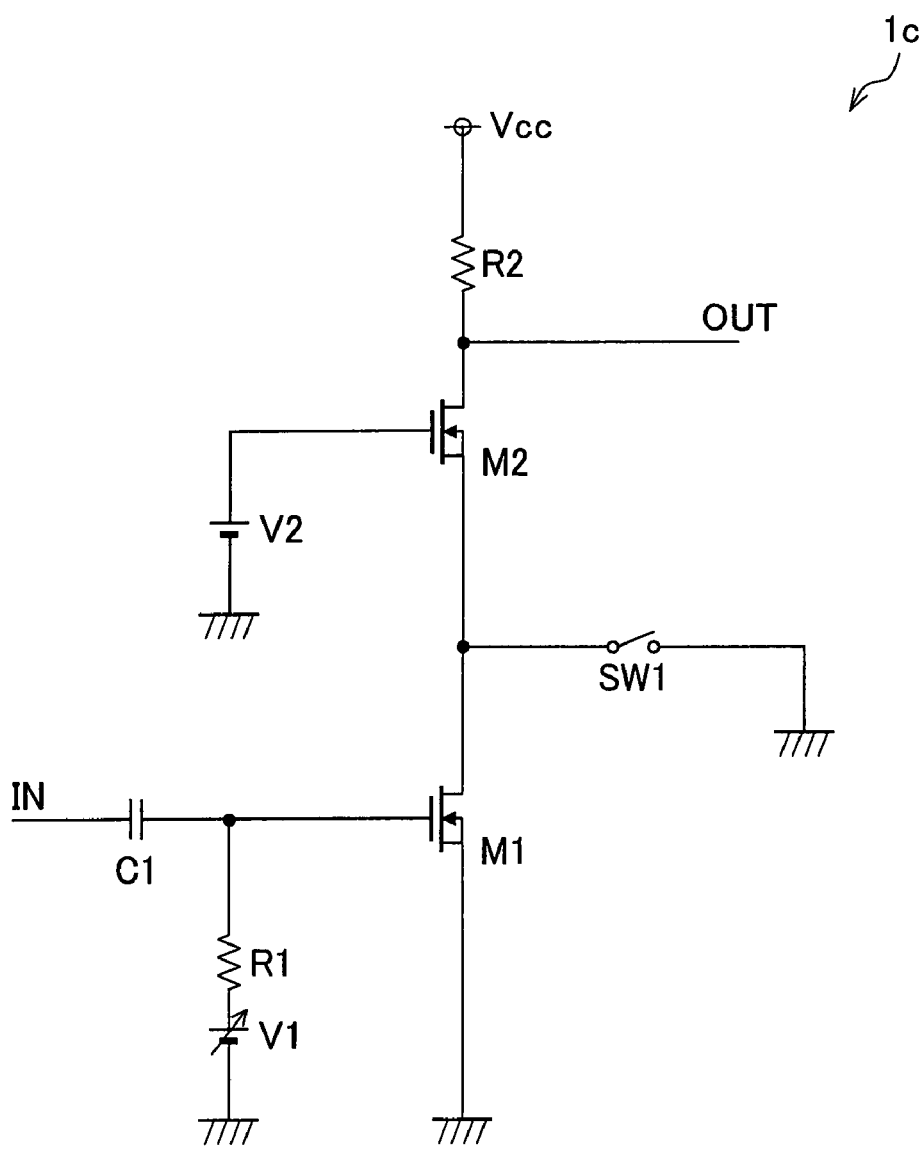
FIG. 5 is a circuit diagram showing another modified example of the arrangement of the cascode-connected amplifier circuit shown in FIG. 1.

Further, the cascode-connected amplifier circuit 1 according to the present embodiment is constituted by cascode-connecting the transistor Q1 to the transistor Q2. However, the present invention is not limited to this. As shown in FIGS. 3 through 5, a grounded-gate MOS transistor (first field-effect transistor) M1 and/or a grounded-source MOS transistor (second field-effect transistor) M2 may be used.

Specifically, FIG. 3 shows a cascode-connected amplifier circuit 1a including a cascode connection of a grounded-emitter transistor Q1 and a grounded-gate MOS transistor M2. Similarly, FIG. 4 shows a cascode-connected amplifier circuit 1b including a cascode connection of a grounded-source MOS transistor M1 and a grounded-base transistor Q2, and FIG. 5 shows a cascode-connected amplifier circuit 1c including a cascode connection of a grounded-source MOS transistor M1 and a grounded-gate MOS transistor M2.

Figure 6:
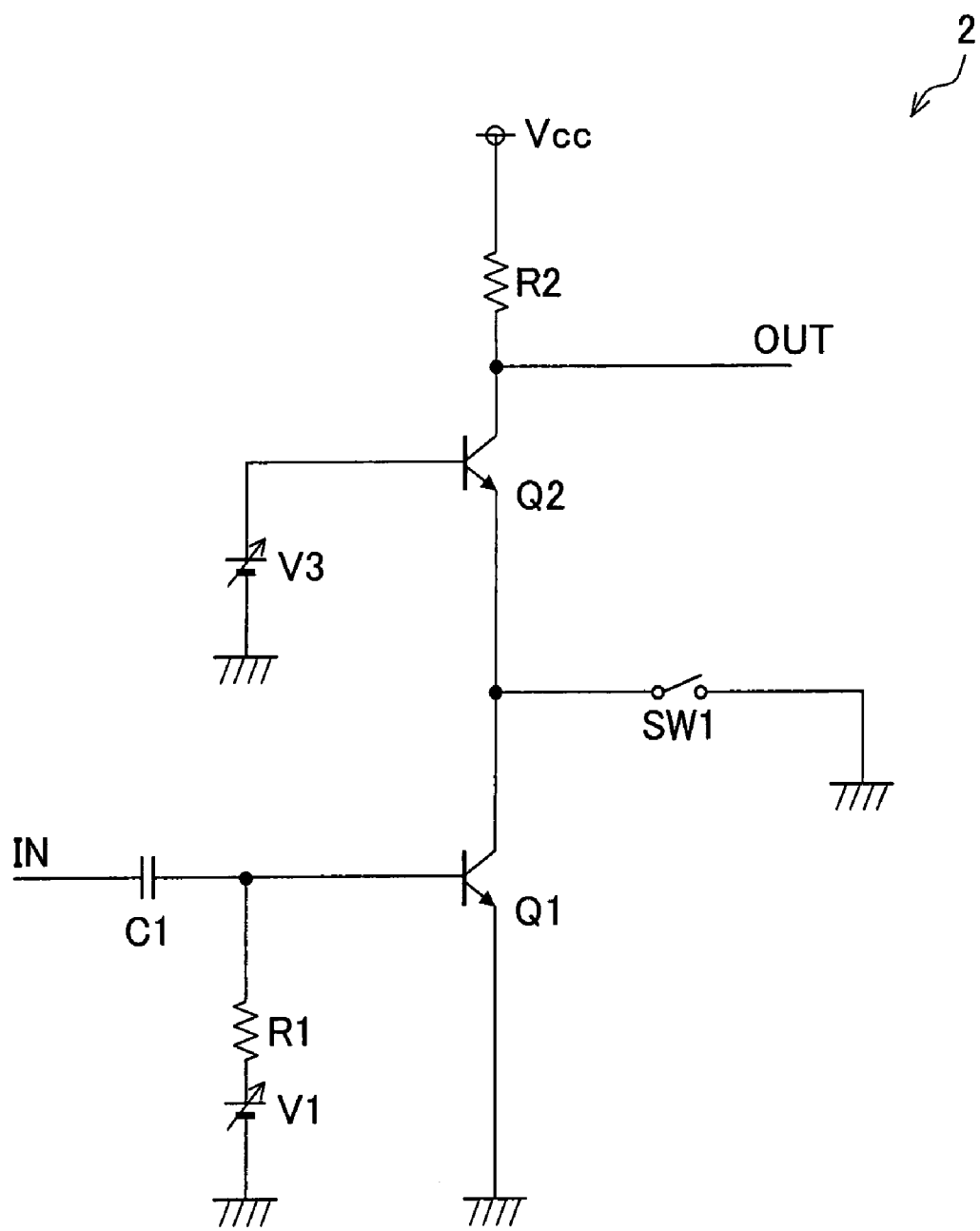
FIG. 6 shows a modified example of the arrangement of the cascode-connected amplifier circuit shown in FIG. 1, and is a circuit diagram showing a cascode-connected amplifier circuit arranged such that an output-side bias power supply is a variable-voltage power supply.

Furthermore, FIG. 6 is a circuit diagram showing an arrangement of a cascode-connected amplifier circuit 2, which is a modified example of the cascode-connected amplifier circuit 1.

The cascode-connected amplifier circuit 2 is different from the cascode-connected amplifier circuit 1 in that: the base of the transistor Q2 of the cascode-connected amplifier circuit 2 is connected to a base voltage power supply (first voltage control means) V3, not to the base voltage power supply V2.

As with the base voltage power supply V1, the base voltage power supply V3 is a variable-voltage power supply, and therefore controls the base voltage of the transistor Q2. This makes it possible that: by reducing the base voltage of the transistor Q2 when the switching element SW1 is on, the base current of the transistor Q2 is reduced.

Thus, when the switching element SW1 is on, operation of the cascode-connected amplifier circuit 2 is stopped. This makes it possible to suppress the current flowing through the transistor Q2, so that power consumption can be reduced.

Note that it is preferable that the base current of the transistor Q2 be held down before the switching element SW1 is switched on.

In this case, the switching element SW1 is controlled such that: when the base voltage of the transistor Q2 becomes less than a predetermined voltage value by reducing the base voltage of the transistor Q2 with the use of the base voltage power supply V3, the switching element SW1 is switched on. This control of the switching element SW1 is realized by a switching control circuit (control means) 107c shown in FIG. 13. The switching control circuit 107c will be fully described later.

Thus, the base voltage of the transistor Q2 can be reduced before the operation of the cascode-connected amplifier circuit 2 is stopped. This makes it possible to reduce the current flowing through the transistor Q2. This allows further reduction in power consumption.

Further, the cascode-connected amplifier circuit 2 is constituted by cascode-connecting the transistor Q1 to the transistor Q2. However, the present invention is not limited to this. As with the cascode-connected amplifier circuit 1, the MOS transistor M1 and/or the MOS transistor M2 may be used. That is, also in each of the cascode-connected amplifier circuits 1a, 1b, and 1c respectively shown in FIGS. 3, 4, and 5, the base voltage power supply V3 may be used instead of the base voltage power supply V2.

Embodiment 2

Another embodiment of the present invention will be described below with reference to FIGS. 7 through 9. Note that: members having the same functions as those described in Embodiment 1 are given the same reference numerals, and will not be described.

Figure 7:
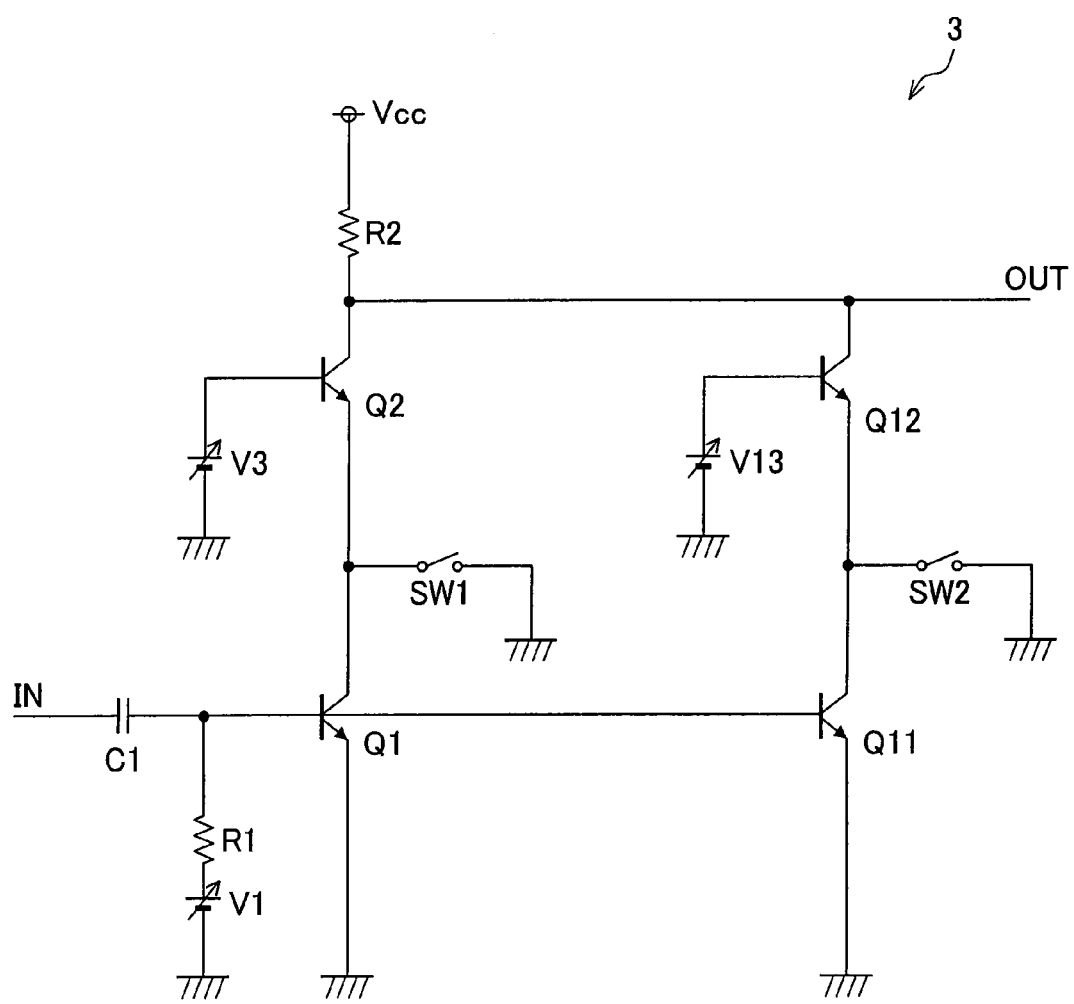
FIG. 7 shows Embodiment 2 of the present invention, and is a circuit diagram showing an arrangement of a cascode-connected amplifier circuit including a plurality of cascode-connected amplifier circuit stages.

FIG. 7 is a circuit diagram showing an arrangement of a cascode-connected amplifier circuit 3 according to the present embodiment.

The cascode-connected amplifier circuit 3 includes (i) a first cascode-connected amplifier circuit in which a grounded-emitter transistor Q1 and a grounded-base transistor Q2 are connected to each other and (ii) a second cascode-connected amplifier circuit in which a grounded-emitter transistor (first transistor) Q11 and a grounded-base transistor (second transistor) Q12 are connected to each other. That is, the cascode-connected amplifier circuit 3 is constituted by the two cascode-connected amplifier circuit stages.

Further, a signal received by the cascode-connected amplifier circuit 3 is inputted to respective bases of the transistors Q1 and Q11 via a coupling capacitor C1, and the coupling capacitor C1 impedes a DC component of the input signal. Furthermore, the transistor Q2 has a collector which is connected to a collector of the transistor Q12 and which outputs a signal amplified or attenuated in the cascode-connected amplifier circuit 3.

Further, the transistor Q1 has a collector connected to a switching element SW1, and the transistor Q11 has a collector connected to a switching element (selecting means) SW2. Moreover, the switching elements SW1 and SW2 have control terminals connected to switching control circuits (not shown), respectively. For this reason, the switching elements SW1 and SW2 can be controlled independently of each other. Note that control of the switching elements SW1 and SW2 will be fully described later.

This makes it possible to control a plurality of cascode-connected amplifier circuit stages independently of one another. That is, for example, operation of the first cascode-connected amplifier circuit is stopped, and then the second cascode-connected amplifier circuit is operated.

Further, the operation of the first and second cascode-connected amplifier circuits can be surely stopped by switching on the switching elements SW1 and SW2, respectively. For this reason, in cases where the operation of the first cascode-connected amplifier circuit is under suspension, a signal hardly leaks from the first cascode-connected amplifier circuit to the second cascode-connected amplifier circuit. This makes it possible to improve linearity and gain suppression.

The cascode-connected amplifier circuit 3 also includes a base voltage power supply V13, the base voltage power supply V13 is a variable-voltage power supply, and therefore controls the base voltage of the transistor Q12. This makes it possible that: by reducing the base voltage of the transistor Q12 when the switching element W2 is on, the base current of the transistor Q12 is reduced.

Figure 8:
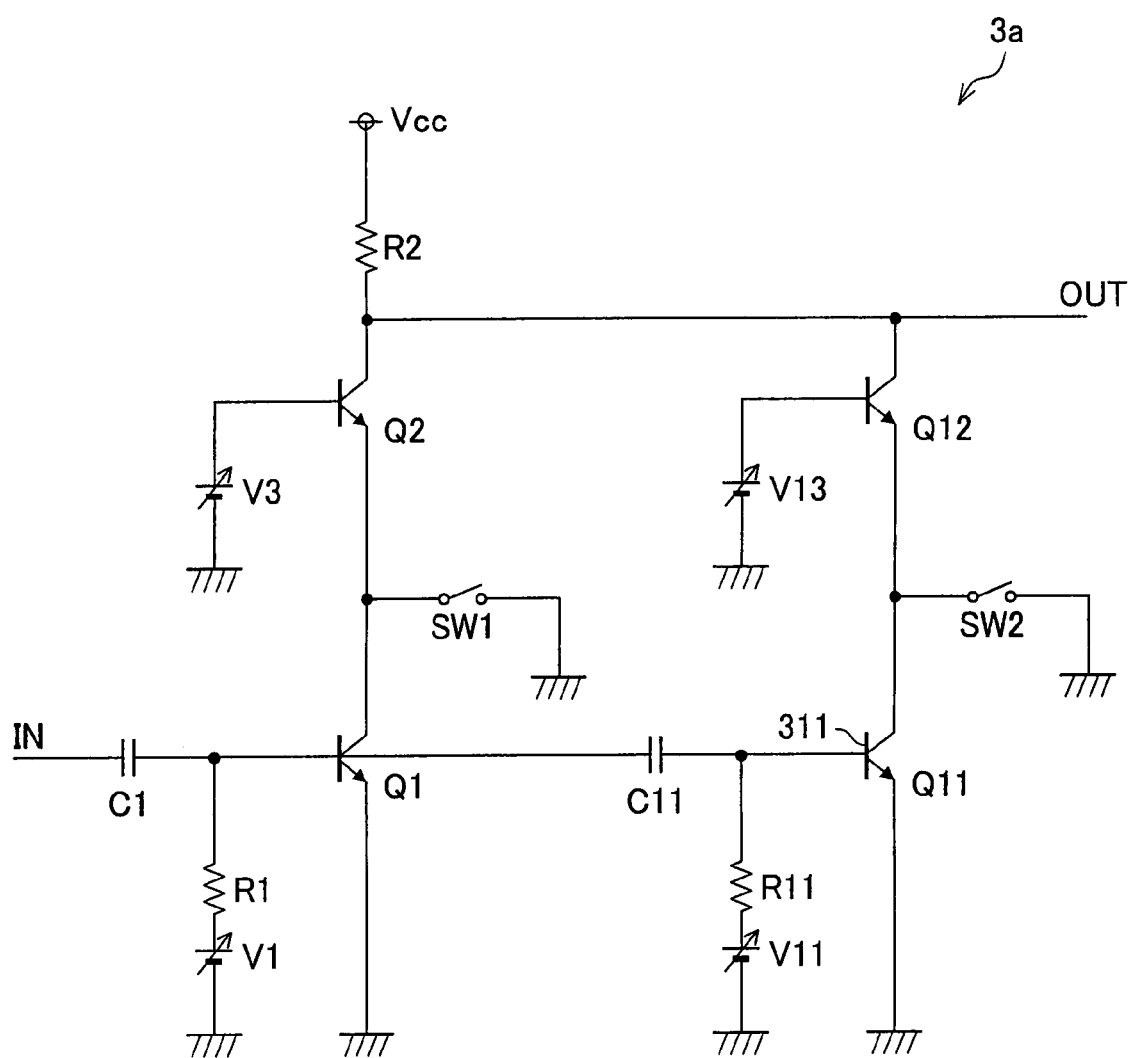
FIG. 8 is a circuit diagram showing a modified example of an arrangement of a cascode-connected amplifier circuit shown in Embodiment 3.

FIG. 8 is a circuit diagram showing an arrangement of a cascode-connected amplifier circuit 3a. The cascode-connected amplifier circuit 3a is different from the cascode-connected amplifier circuit 3 in that cascode-connected amplifier circuit 3a includes a base voltage power supply V11, a bias resistor R11, and a coupling capacitor C11.

The coupling capacitor C11 is inserted between the respective bases of the transistors Q1 and Q11. Further, the base voltage power supply V11 is connected to the base of the transistor Q11 via the bias resistor R11.

As with the base voltage power supply V1, the base voltage power supply V11 is a variable-voltage power supply, and controls the base current of the transistor Q11. Thus, the gain of the cascode-connected amplifier circuit 3a is controlled.

Further, by appropriately selecting a capacitance value of the coupling capacitor C11, it is possible to intentionally change (design) the level of a signal to be inputted to the transistors Q1 and Q11. Further, each of the transistors Q1 and Q11 has an operating point that can be changed, so that the gain of each of the cascode-connected amplifier circuits can be freely changed. This makes it possible to design, with a high degree of freedom, each of the cascode-connected amplifier circuits constituting the cascode-connected amplifier circuit 3a.

Figure 9:
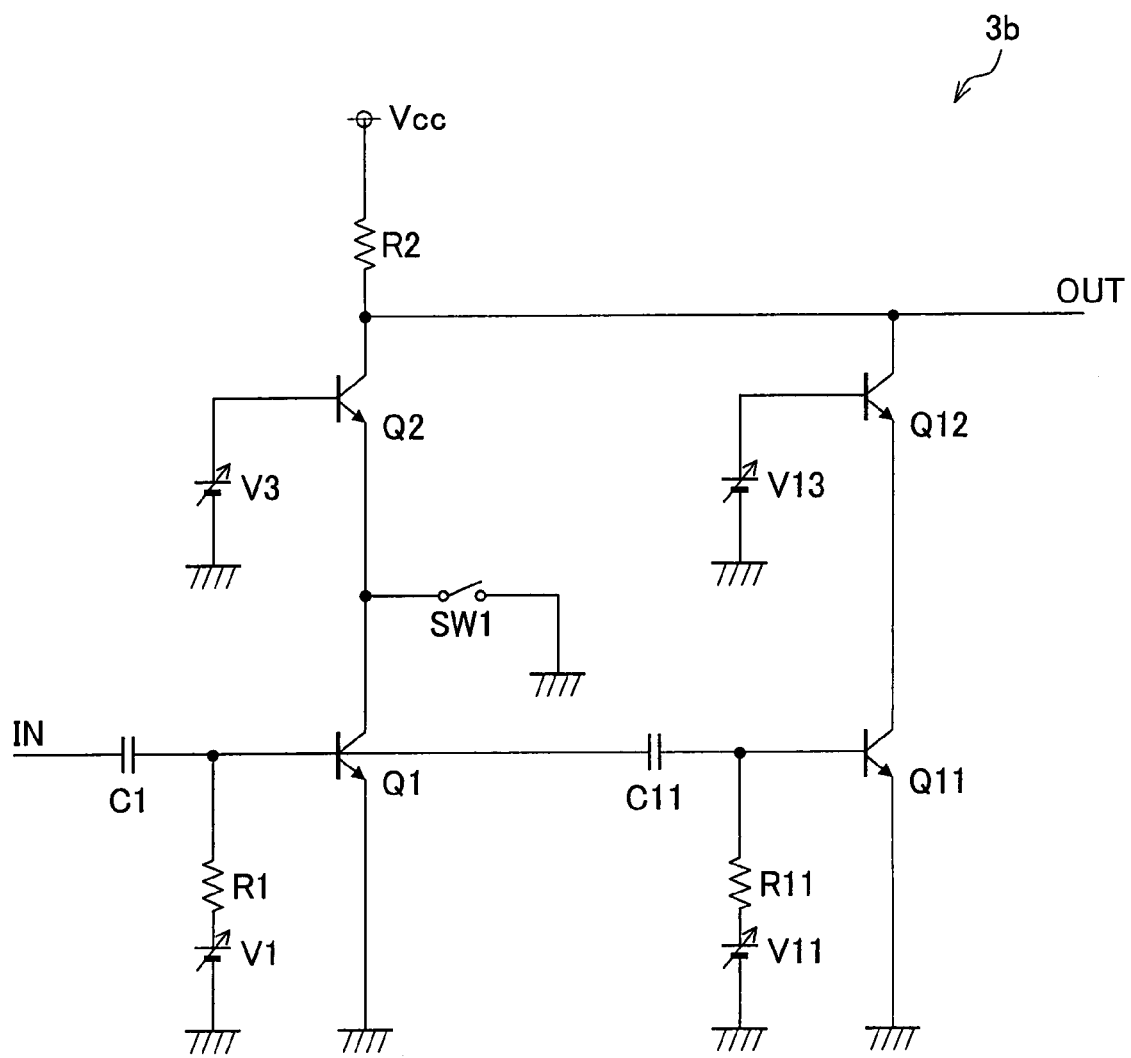
FIG. 9 is a circuit diagram showing another modified example of the arrangement of the cascode-connected amplifier circuit shown in Embodiment 3.

FIG. 9 is a circuit diagram showing an arrangement of a cascode-connected amplifier circuit 3b. The cascode-connected amplifier circuit 3b is different from the cascode-connected amplifier circuit 3a in that: no switching element 2 is connected to the collector of the transistor Q11 although the switching element SW1 is connected to the collector of the transistor Q1.

In the cascode-connected amplifier circuit 3b, the gain of the transistor Q1 is sufficiently greater than the gain of the transistor Q11. For this reason, in cases where a signal leaks from the transistor Q11, as compared with a case where a signal leaks from the transistor Q1, linearity and gain suppression can be better inhibited from being deteriorated.

Therefore, in cases where a plurality of cascode-connected amplifier circuit stages are connected to one another and the gain of a grounded-emitter transistor is higher than a predetermined threshold value, a collector of the transistor only needs to be provided with a switching element.

Thus, as compared with an arrangement in which a grounded-emitter transistor of each of the cascode-connected amplifier circuits is provided with a switching element, the number of switching elements can be reduced. This makes it possible to reduce the size of the circuit.

Each of the first and second cascode-connected amplifier circuits in the cascode-connected amplifier circuits 3, 3a, and 3b is constituted by a bipolar transistor. However, the present invention is not limited to this. Each of the first and second cascode-connected amplifier circuits in the cascode-connected amplifier circuits 3, 3a, and 3b may be constituted by a MOS transistor. That is, each of the first and second cascode-connected amplifier circuits may be constituted by any one of the cascode-connected amplifier circuits 1a, 1b, and 1c respectively shown in FIGS. 3, 4, and 5. Further, each of the cascode-connected amplifier circuits 3, 3a, and 3b is constituted by the first and second cascode-connected amplifier circuits. However, the present invention is not limited to this. Each of the cascode-connected amplifier circuits 3, 3a, and 3b may be constituted by three or more cascode-connected amplifier circuit stages.

The bipolar transistor and the MOS transistor each of which constitutes the cascode-connected amplifier circuit according to each of the embodiments are an NPN bipolar transistor and an N-channel MOS transistor, respectively. However, the present invention is not limited to this. The bipolar transistor and the MOS transistor each of which constitutes the cascode-connected amplifier circuit according to each of the embodiments may be a PNP bipolar transistor and a P-channel MOS transistor, respectively.

Further, the bipolar transistor refers to an NPN bipolar transistor, a PNP bipolar transistor, an IGBT (insulated gate bipolar transistor), and the like; the MOS transistor refers to a MOSFET (metal-oxide semiconductor field-effect transistor). The cascode-connected amplifier circuit according to each of the embodiments uses a MOS transistor. However, the present invention is not limited to this. The cascode-connected amplifier circuit according to each of the embodiments may use a field-effect transistor such as a MESFET (metal semiconductor field-effect transistor), a MISFET (metal-insulator semiconductor field-effect transistor), or a JFET (junction field-effect transistor).

Further, each of the base of the grounded-emitter transistor and the gate of the grounded-source MOS transistor are connected to the base voltage power supply V1 via the bias resistor R1; however, the bias resistor R1 may be replaced by a coil, a diode, a field-effect transistor, a bipolar transistor, or the like. Further, the power supply voltage Vcc is applied to each of the collector of the grounded-base transistor and the drain of the grounded-gate MOS transistor via the load resistor R2; however, the load resistor R2 may be replaced by a coil or the like.

Furthermore, each of the emitter of the grounded-emitter transistor and the source of the grounded-source transistor are directly grounded; however, the emitter and the source may be grounded via a resistor, a coil, or the like.

The cascode-connected amplifier circuit 3 also includes a base voltage power supply V13, the base voltage power supply V13 is a variable-voltage power supply, and therefore controls the base voltage of the transistor Q12.

Embodiment 3

Another embodiment of the present invention will be described below with reference to FIGS. 10 through 13. Note that: members having the same functions as those described in Embodiment 1 or 2 are given the same reference numerals, and will not be described.

Figure 10:
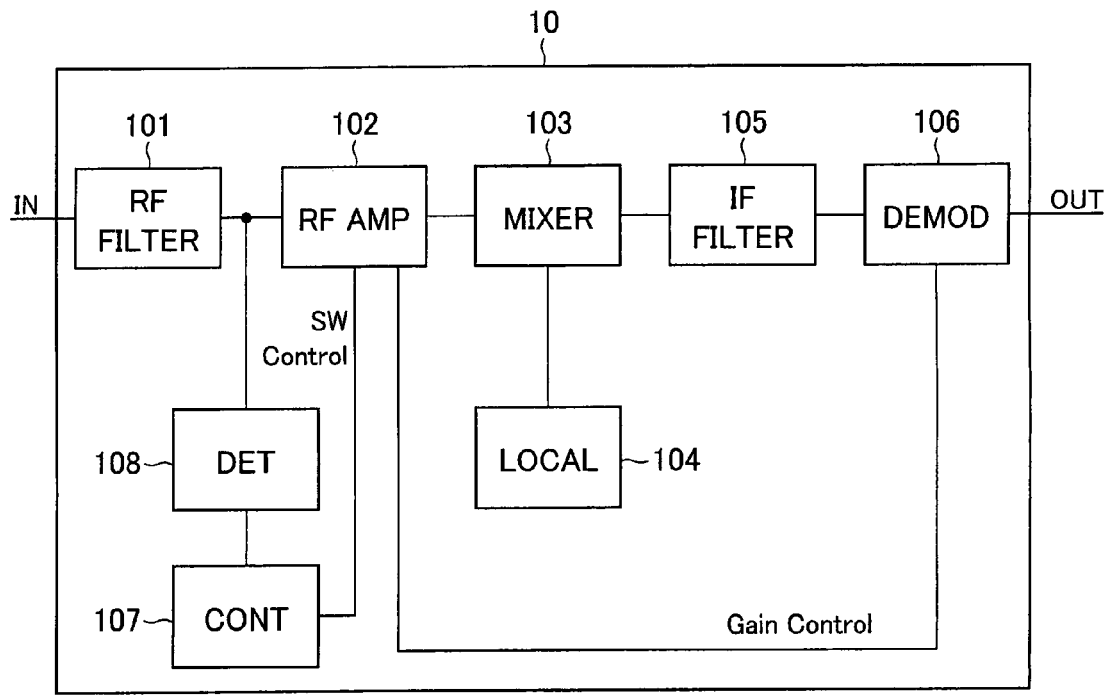
FIG. 10 is a block diagram schematically showing an example of a receiving apparatus including a cascode-connected amplifier circuit shown in each of Embodiments.

FIG. 10 is a block diagram schematically showing an example of a receiving apparatus 10 including any one of the cascode-connected amplifier circuits 1, 1a, 1b, 1c, 2, 3, 3a, and 3b according to the aforementioned embodiments.

The receiving apparatus 10 includes a radio-frequency band filter 101, a radio-frequency amplifier 102, a frequency-converting multiplier 103, a local signal generator 104, an intermediate-frequency band filter 105, and a demodulator circuit 106.

The radio-frequency band filter 101 restricts, to a signal band containing a desired frequency, a radio-frequency signal received by the receiving apparatus 10, and then sends the radio-frequency signal to the radio-frequency amplifier 102.

The radio-frequency amplifier 102 includes any one of the cascode-connected amplifier circuits 1, 1a, 1b, 1c, 2, 3, 3a, and 3b according to the aforementioned embodiments. The radio-frequency amplifier 102 receives the radio-frequency signal, amplifies or attenuates the radio-frequency signal, and sends the radio-frequency signal to the frequency-converting multiplier 103.

The frequency-converting multiplier 103 receives the radio-frequency signal from the radio-frequency amplifier 102 and a local signal from the local signal generator 104, and converts the radio-frequency signal into an intermediate-frequency signal by multiplying the radio-frequency signal by the local signal. Then, the frequency-converting multiplier 103 sends the intermediate-frequency signal to the following intermediate-frequency band filter 105.

The intermediate-frequency band filter 105 restricts the intermediate-frequency signal to a signal band containing a desired frequency, and then sends the intermediate-frequency signal to the demodulator circuit 106.

The demodulator circuit 106 sends a gain control signal to the radio-frequency amplifier 102 so that the received intermediate-frequency signal has a certain signal level, thereby controlling the gain of the radio-frequency amplifier 102. Specifically, when the signal level of the received intermediate-frequency signal is low, the demodulator circuit 106 generates a gain control signal so that the gain of the radio-frequency amplifier 102 is increased. Alternatively, when the signal level is high, the demodulator circuit 106 generates a gain control signal so that the gain is reduced. Then, the demodulator circuit 106 sends the gain control signal to the radio-frequency amplifier 102. Further, the intermediate-frequency signal received by the demodulator circuit 106 is digitally processed in the demodulator circuit 106, and then is sent to a following circuit connected to the receiving apparatus 10.

Further, the receiving apparatus 10 includes a switching control circuit (control means) 107 and a signal strength index circuit 108. The switching control circuit 107 is connected to (i) the control terminal of the switching element SW1 provided in the cascode-connected amplifier circuit 1, 1a, 1b, 1c, 2, 3, 3a, or 3b and (ii) the signal strength index circuit 108. Further, the signal strength index circuit 108 is connected to a stage subsequent to the radio-frequency band filter 101.

The signal strength index circuit 108 detects the signal level of a radio-frequency signal that is to be received by the radio-frequency amplifier 102, and sends a result of the detection to the switching control circuit 107.

The switching control circuit 107 refers to the result obtained by detecting the signal level, and sends a control signal to the switching element SW1 provided in the cascode-connected amplifier circuit 1, 1a, 1b, 1c, 2, 3, 3a, or 3b. Specifically, in cases where the signal level reaches a predetermined threshold value, the switching control circuit 107 sends, to the switching element SW1, a control signal to switch on the switching element SW1. On the other hand, in cases where the signal level is less than the predetermined threshold value, the switching control circuit 107 sends, to the switching element SW1, a control signal to switch off the switching element SW1. Thus, the switching of the switching element SW1 is controlled.

Further, the switching control circuit 107 controls the switching of the switching element SW1 with reference to the detection result obtained in the signal strength index circuit 108. However, the present invention is not limited to this. For example, the switching of the switching element SW1 may be controlled with reference to a detection result obtained in the demodulator circuit 106.

Figure 11:
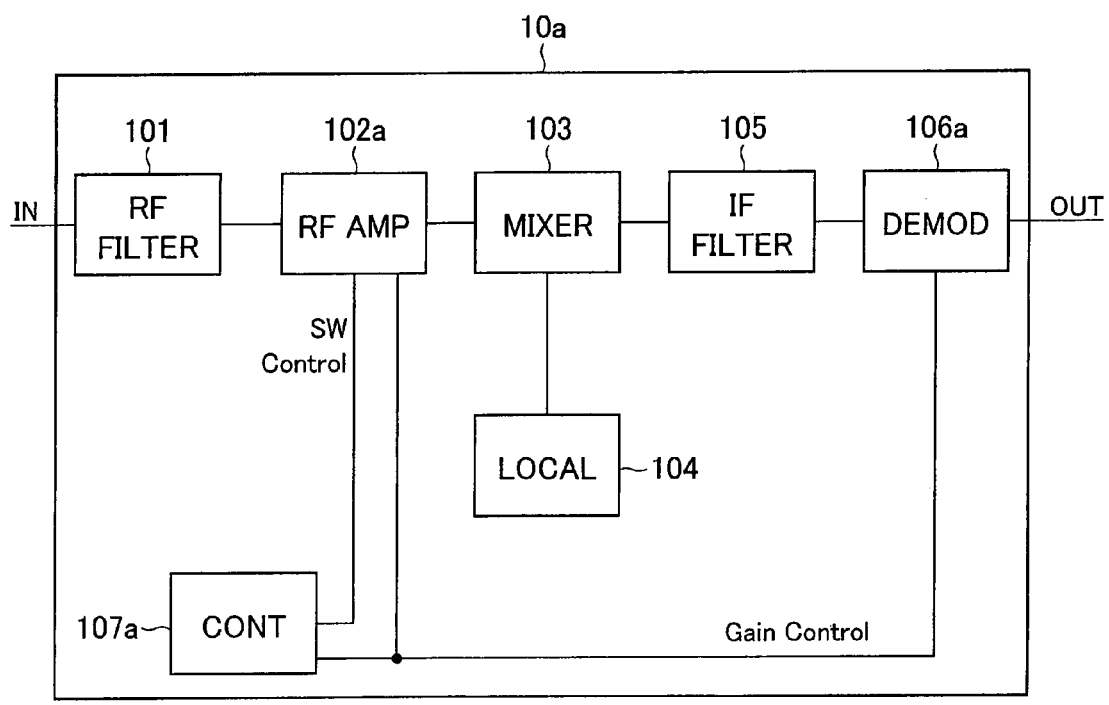
FIG. 11 is a block diagram schematically showing another example of the receiving apparatus including the cascode-connected amplifier circuit shown in each of Embodiments.

FIG. 11 is a block diagram schematically showing another example of the receiving apparatus including any one of the cascode-connected amplifier circuits 1, 1a, 1b, 1c, 2, 3, 3a, and 3b. As shown in FIG. 11, a receiving apparatus 10a is arranged such that the signal strength index circuit 108 has been removed from the receiving apparatus 10. Note that a radio-frequency amplifier 102a has the same functions as those of the radio-frequency amplifier 102 described above. Further, a demodulator circuit 106a has the same functions as those of the demodulator circuit 106 described above, and a switching control element 107a has the same functions as those of the switching control element 107 described above.

In order to control the gain of the radio-frequency amplifier 102a, the demodulator circuit 106a sends a gain control signal to the switching control circuit (control means) 107a as well as the radio-frequency amplifier 102a. According to the gain control signal, as described above, the gain is controlled in accordance with the signal level of the intermediate-frequency signal received by the demodulator circuit 106a. Therefore, the signal strength of the radio-frequency signal can be detected from the gain control signal. This makes it possible for the switching control circuit 107a to control the switching of the switching element SW1 in accordance with the signal level of the gain control signal.

As described above, each of the switching control circuits 107 and 107a control the switching element SW1, so that the operation of the cascode-connected amplifier circuits 1, 1a, 1b, 1c, 2, 3, 3a, or 3b can be stopped.

Note that the switching control circuit 107 may determine, in accordance with (i) the detection result obtained from the signal strength index circuit 108 and (ii) the gain control signal sent from the demodulator circuit 106, whether the switching element SW1 is switched on or off.

The switching control circuit 107 controls the switching of the switching element SW1 in accordance with the result obtained from the signal strength index circuit 108 provided in the receiving apparatus 10. Alternatively, the switching control circuit 107a controls the switching of the switching element SW1 in accordance with the result obtained from the demodulator circuit 106a provided in the receiving apparatus 10a. However, the present invention is not limited to this. The switching of the switching element SW1 may be controlled in accordance with the value of the base voltage of the transistor Q1 or Q2 provided in the cascode-connected amplifier circuit 1, 1a, 1b, 1c, or 2 according to the aforementioned embodiment.

Figure 12:
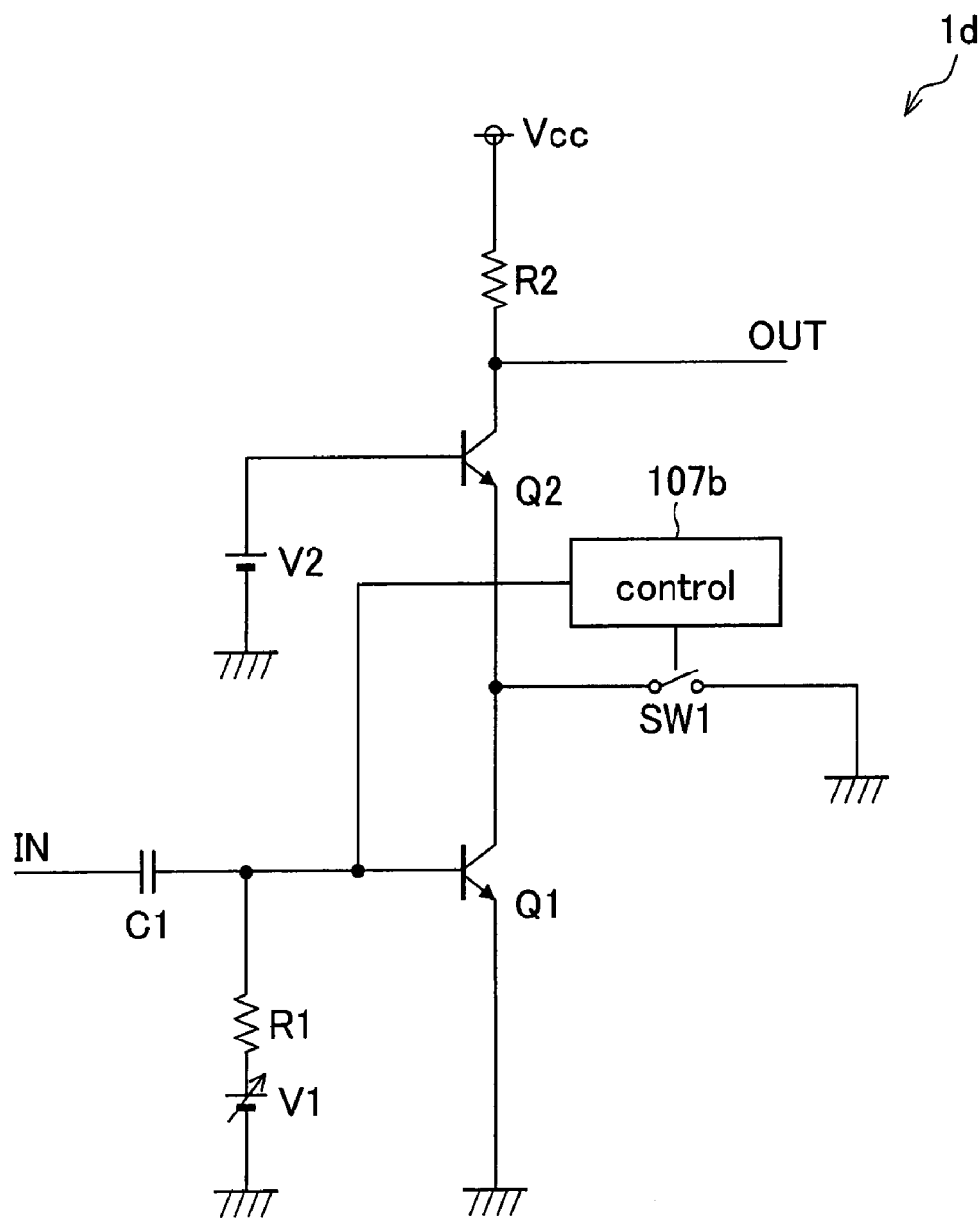
FIG. 12 is a circuit diagram illustrating that the cascode-connected amplifier circuit shown in FIG. 1 is arranged such that a switching control circuit is connected to a base of an input-side transistor.

As shown in FIG. 12, a cascode-connected amplifier circuit 1d is arranged such that a switching control circuit (control means) 107b is connected to the base of the transistor Q1 provided in the cascode-connected amplifier circuit 1.

The switching control circuit 107b is connected to the base of the transistor Q1, and receives the base voltage of the transistor Q1 which base voltage is controlled by the base voltage power supply V1. Further, the switching control circuit 107b is connected to the control terminal of the switching element SW1.

Therefore, in cases where the base voltage of the transistor Q1 is less than a predetermined voltage value, the switching control circuit 107b sends, to the switching element SW1, a control signal to switch on the switching element SW1. On the other hand, in cases where the base voltage is not less than the predetermined voltage value, the switching control circuit 107b sends, to the switching element SW1, a control signal to switch off the switching element SW1. Thus, the switching of the switching element SW1 is controlled.

In the cascode-connected amplifier circuit 1d, the base voltage power supply V2 connected to the base of the transistor Q2 is not a variable-voltage power supply. However, the present invention is not limited to this. The base voltage power supply V2 may be replaced by the base voltage power supply V3 serving as a variable-voltage power supply. That is, the switching control circuit 107b may be applied to the cascode-connected amplifier circuit 2.

Figure 13:
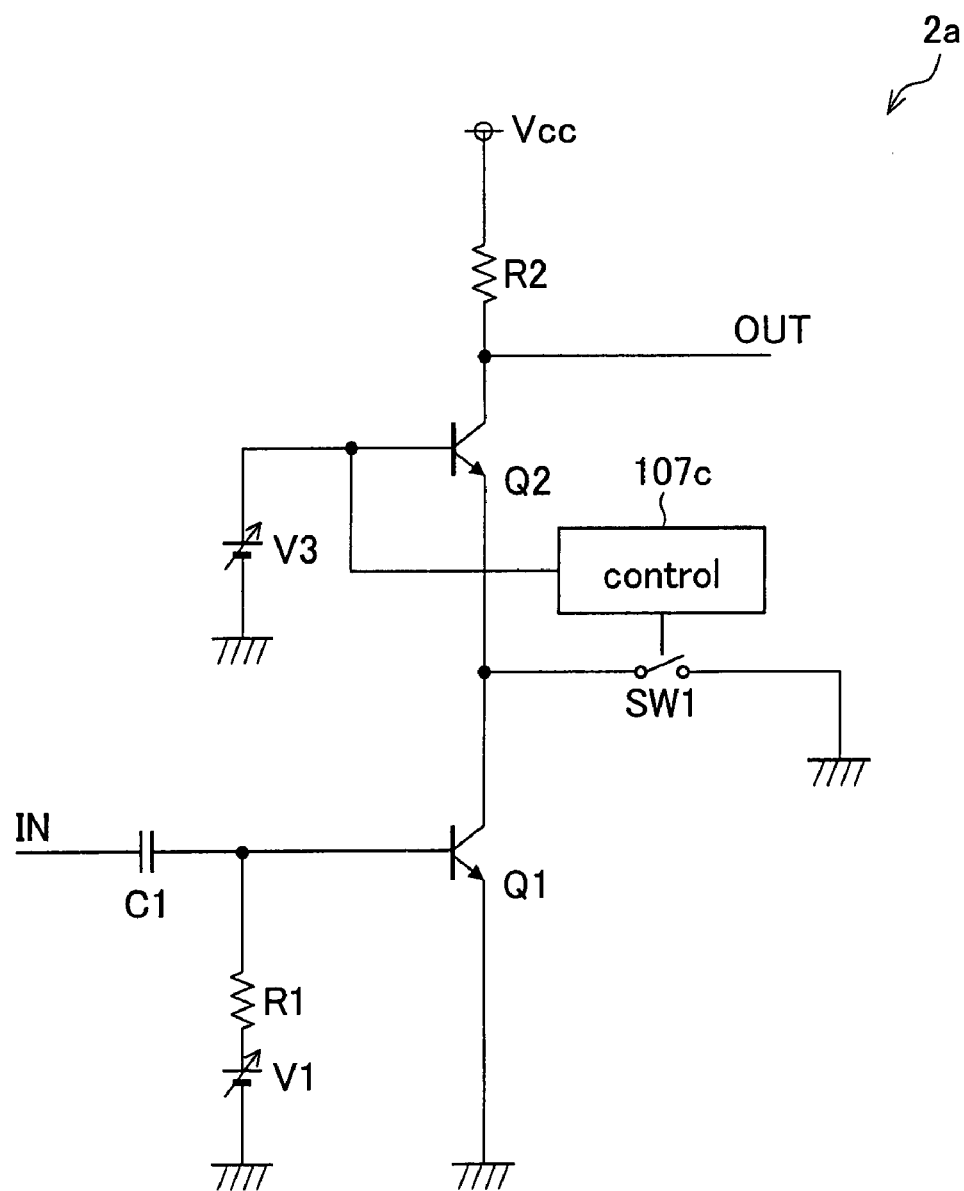
FIG. 13 is a circuit diagram illustrating that the cascode-connected amplifier circuit shown in FIG. 6 is arranged such that a switching control circuit is connected to a base of an output-side transistor.
Figure 14:
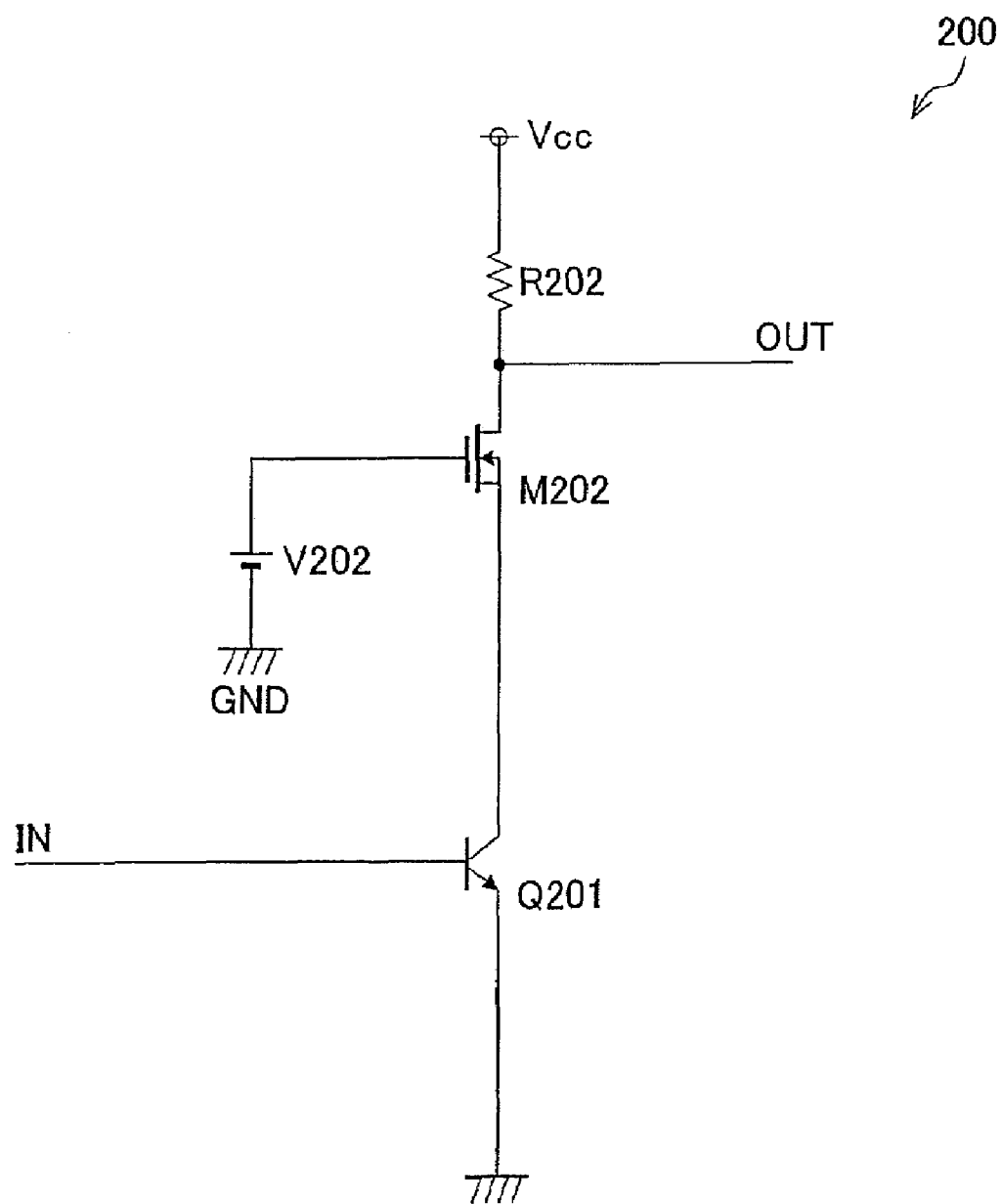
FIG. 14 is a circuit diagram showing an arrangement of a conventional cascode-connected amplifier circuit.

Further, as shown in FIG. 13, a cascode-connected amplifier circuit 2a is arranged such that a switching control circuit 107c is connected to the base of the transistor Q2 provided in the cascode-connected amplifier circuit 2.

The switching control circuit 107c is connected to the base of the transistor Q2, and receives the base voltage of the transistor Q2 which base voltage is controlled by the base voltage power supply V3. Further, the switching control circuit 107c is connected to the control of the switching element SW1.

As with the base voltage power supply V1, the base voltage power supply V3 is a variable-voltage power supply, and therefore can control the base voltage of the transistor Q2. Thus, as with the switching control circuit 107b, the switching control circuit 107c can control the switching element SW1 in accordance with the value of the base voltage.

Specifically, in cases where the base voltage of the transistor Q2 is less than a predetermined voltage value, the switching control circuit 107c sends, to the switching element SW1, a control signal to switch on the switching element SW1. Meanwhile, in cases where the base voltage is not less than the predetermined voltage value, the switching control circuit 107c sends, to the switching element SW1, a control signal to switch off the switching element SW1. Thus, the switching of the switching element SW1 can be controlled.

As described above, the switching control circuit 107b and the switching control circuit 107c control the switching element SW1, so that the operation of the cascode-connected amplifier circuits 1d and 2a can be stopped, respectively.

The cascode-connected amplifier circuit 1d is constituted by a bipolar transistor. However, the present invention is not limited to this. The cascode-connected amplifier circuit 1d may be constituted by the MOS transistor M1 and/or the MOS transistor M2. That is, the switching control circuit 107 b may be provided in each of the cascode-connected amplifier circuits 1a, 1b, and 1c respectively shown in FIGS. 3, 4, and 5. Further, the switching control circuit 107b and 107c may be provided in the cascode-connected amplifier circuit 2, 3, 3a, or 3b according to the aforementioned embodiment.

Further, each of the switching control circuits 107, 107a, 107b, and 107c controls the switching element SW1. However, the present invention is not limited to this. The switching element SW2 is controlled in the same way.

Note that: each of the cascode-connected amplifier circuits 1, 1a, 1b, 1c, 2, 3, 3a, and 3b can be produced on a circuit board by using only elements (e.g., transistors, resistors, and capacitors) that can be formed by a normal semiconductor process, and therefore can be incorporated into a semiconductor integrated circuit together with other circuit structures.

As described above, a cascode-connected amplifier circuit according to an embodiment of the present invention includes: a first transistor having a grounded emitter or a first field-effect transistor having a grounded source; (a) a second transistor, having a grounded base, which is cascode-connected to the first transistor or to the first field-effect transistor, or (b) a second field-effect transistor, having a grounded gate, which is cascode-connected to the first transistor or to the first field-effect transistor; and selecting means for causing a collector of the first transistor or a drain of the first field-effect transistor to be grounded.

According to the foregoing arrangement, in cases where the collector of the first transistor having the grounded emitter is grounded by the selecting means, the collector and emitter of the first transistor have the same potential. Therefore, no current flows between the collector and emitter of the first transistor. Alternatively, in cases where the drain of the first field-effect transistor having the grounded source is grounded by the selecting means, the drain and source of the first field-effect transistor have the same potential. Therefore, no current flows between the drain and source of the first field-effect transistor.

With this, operation of the cascode-connected amplifier circuit can be surely stopped even in cases where the first transistor is undesirably operated under the influence of (i) a voltage applied to the base of the first transistor or (ii) the like, or in cases where the first field-effect transistor is undesirably operated under the influence of (a) a voltage applied to the gate of the first field-effect transistor or (b) the like. This makes it possible to improve isolation.

The cascode-connected amplifier circuit according to the embodiment of the present invention is preferably arranged so as to further include: first voltage control means for controlling a voltage to be applied to the base of the second transistor or to the gate of the second field-effect transistor, wherein: the first voltage control means controls a voltage to be applied to the base of the second transistor while the selecting means grounds the collector or the drain, so as to reduce a current flowing through the second transistor, or the first voltage control means controls a voltage to be applied to the gate of the second field-effect transistor while the selecting means grounds the collector or the drain, so as to reduce a current flowing through the second field-effect transistor.

According to the foregoing arrangement, the first voltage control means controls, by controlling the voltage to be applied to the base of the second transistor, the current flowing through the second transistor. Alternatively, the first voltage control means controls, by controlling the voltage to be applied to the gate of the second field-effect transistor, the current flowing through the second field-effect transistor.

Thus, the current flowing through the second transistor or through the second field-effect transistor can be reduced with the use of the first voltage control means when the collector of the first transistor or the drain of the first field-effect signal is grounded by the selecting means.

Therefore, the current flowing through the second transistor or through the second field-effect transistor can be suppressed when the operation of the cascode-connected amplifier circuit is under suspension. This makes it possible to reduce power consumption.

It is preferable that the first voltage control means operates before the selecting means grounds the collector or the drain, so as to reduce in advance the voltage to be applied to the base of the second transistor or to the gate of the second field-effect transistor.

According to the foregoing arrangement, the first voltage control means reduces the voltage to be applied to the base of the second transistor or to the gate of the second field-effect transistor before the selecting means is caused to be conductive, so as to reduce the current flowing through the second transistor or through the second field-effect transistor is reduced.

Thus, the current flowing through the second transistor or through the second field-effect transistor can be reduced before the operation of the cascode-connected amplifier circuit is stopped. This makes it possible to further reduce power consumption.

It is preferable that the selecting means is controlled so as to (i) become conductive when an input signal reaches a predetermined threshold value and (ii) become nonconductive when the input signal is less than the predetermined threshold value.

According to the foregoing arrangement, whether or not the selecting means becomes conductive is determined in accordance with a result obtained by comparing (i) the signal level of the signal to be received by the cascode-connected amplifier circuit with (ii) the predetermined threshold value. The signal level of the input signal is detected, for example, by a signal strength index circuit provided in a receiving apparatus.

This makes it possible that: the selecting means is caused to be conductive when the input signal has a high signal level, so that the operation of the cascode-connected amplifier circuit is stopped. This makes it possible to improve isolation.

It is preferable that the input signal is detected in accordance with a control voltage by which a gain of the cascode-connected amplifier circuit is controlled.

According to the foregoing arrangement, the selecting means can be controlled by detecting the control voltage by which the gain of the cascode-connected amplifier circuit is controlled as well as by directly detecting the signal received by the cascode-connected amplifier circuit.

This makes it possible that: the selecting means is caused to be conductive when the signal level of the input signal is high, so that the operation of the cascode-connected amplifier circuit is stopped. This makes it possible to improve isolation.

The cascode-connected amplifier circuit according to the embodiment of the present invention is preferably arranged so as to further include: second voltage control means for controlling a voltage to be applied to the base of the first transistor or to the gate of the first field-effect transistor, wherein the selecting means is controlled in accordance with a voltage to be applied to the base of the first transistor or to the gate of the first field-effect transistor.

According to the foregoing arrangement, the voltage to be applied to the base of the first transistor is controlled by the second voltage control means so as to be less than a transistor's threshold voltage value, with the result that the operation of the first transistor can be stopped. Alternatively, the voltage to be applied to the gate of the first field-effect transistor is controlled by the second voltage control means so as to be less than a transistor's threshold voltage value, with the result that the operation of the first field-effect transistor can be stopped.

This makes it possible that: the voltage to be applied to the base or to the gate is compared with the predetermined threshold value when the voltage to be applied to the base or to the gate is reduced by the second voltage control means, so that a selecting operation of the selecting means is controlled. This makes it possible to stop the operation of the cascode-connected amplifier circuit.

It is preferable that, in the arrangement in which the first voltage control means is provided, the selecting means be controlled in accordance with a voltage to be applied to the base of the second transistor or to the gate of the second field-effect transistor.

According to the foregoing arrangement, the voltage to be applied to the base of the second transistor is controlled by the first voltage control means so as to be less than a predetermined threshold voltage value, with the result that the operation of the second transistor can be stopped. Alternatively, the voltage to be applied to the gate of the second field-effect transistor is controlled by the first voltage control means so as to be less than a transistor's threshold voltage value, with the result that the operation of the second field-effect transistor can be stopped.

This makes it possible that: the voltage to be applied to the base or to the gate is compared with the predetermined threshold value when the voltage to be applied to the base or to the gate is reduced by the first voltage control means, so that a selecting operation of the selecting means is controlled. This makes it possible to stop the operation of the cascode-connected amplifier circuit.

A cascode-connected amplifier circuit according to another embodiment of the present invention includes a plurality of cascode-connected amplifier circuits each of which is the cascode-connected amplifier circuit of the foregoing arrangement, (i) a collector of a second transistor in a first cascode-connected amplifier circuit or (ii) a drain of a second field-effect transistor in the first cascode-connected amplifier circuit being connected to (a) a collector of a second transistor in a second cascode-connected amplifier circuit or (b) a drain of a second field-effect transistor in the second cascode-connected amplifier circuit, (I) a base of a first transistor in the first cascode-connected amplifier circuit or (II) a gate of a first field-effect transistor in the first cascode-connected amplifier circuit being connected to (A) a base of the first transistor in the second cascode-connected amplifier circuit or (B) a gate of the first field-effect transistor in the second cascode-connected amplifier circuit, the first and second cascode-connected amplifier circuits being adjacent to each other.

According to the foregoing arrangement, the plurality of cascode-connected amplifier circuits are provided. This makes it possible to extend ranges of characteristics such as gain and linearity with no influence of another cascode-connected amplifier circuit stage whose operation is under suspension. That is, it becomes possible to improve linearity and gain suppression.

It is preferable that (i) the base of the first transistor provided in the first cascode-connected amplifier circuit or (ii) the gate of the first field-effect transistor in the first cascode-connected amplifier circuit and (a) the base of the first transistor in the second cascode-connected amplifier circuit or (b) the gate of the first field-effect transistor in the second cascode-connected amplifier circuit are connected to each other via a coupling capacitor.

According to the foregoing arrangement, by appropriately selecting a capacitance value of the coupling capacitor, it is possible to intentionally change (design), with a high degree of freedom, the level of a signal to be inputted to the first transistor or first field-effect transistor provided in each cascode-connected amplifier circuit. Further, the first transistor or the first field-effect transistor has an operating point that can be changed, so that the gain of each of the cascode-connected amplifier circuits can be freely changed. Therefore, the cascode-connected amplifier circuit can be designed with a high degree of freedom.

It is preferable that the selecting means is provided in a cascode-connected amplifier circuit whose gain is higher than a predetermined threshold value.

According to the foregoing arrangement, signal leakage occurs in each of the plurality of cascode-connected amplifier circuits, with the result that linearity and gain suppression are deteriorated. However, signal leakage from a cascode-connected amplifier circuit with low gain is less likely to cause deterioration of the linearity and gain suppression of the plurality of cascode-connected amplifier circuits than is signal leakage from a cascode-connected amplifier circuit with high gain.

Therefore, it is only necessary to provide the selecting means in the cascode-connected amplifier circuit whose gain is higher than the predetermined threshold value. This makes it possible to reduce the size of the plurality of cascode-connected amplifier circuits.

It is preferable that the selecting means be a MEMS switch.

According to the foregoing arrangement, the MEMS switch is used as the selecting means, so that the influence of an on-resistance can be reduced as compared with a normally employed MOS switch or CMOS switch.

It is preferable that a semiconductor integrated circuit of the present invention and a receiving apparatus of the present invention each include the cascode-connected amplifier circuit of the foregoing arrangement. Further, it is preferable that the receiving apparatus of the present invention include the semiconductor integrated circuit of the foregoing arrangement. Such a receiving apparatus includes the cascode-connected amplifier circuit of the foregoing arrangement whose isolation has been improved. This makes it possible to improve the quality of a signal received by the receiving apparatus and amplified by the amplifier circuit.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A cascode-connected amplifier circuit comprising:
a first transistor having a grounded emitter or a first field-effect transistor having a grounded source;
(a) a second transistor, having a grounded base, which is cascode-connected to the first transistor or to the first field-effect transistor, or (b) a second field-effect transistor, having a grounded gate, which is cascode-connected to the first transistor or to the first field-effect transistor;
a selecting unit causing a collector of the first transistor or a drain of the first field-effect transistor to be grounded;
a first voltage control unit controlling a voltage to be applied to the base of the second transistor or to the gate of the second field-effect transistor, wherein:
the first voltage control unit controls a voltage to be applied to the base of the second transistor while the selecting unit grounds the collector or the drain, so as to reduce a current flowing through the second transistor, or
the first voltage control unit controls a voltage to be applied to the gate of the second field-effect transistor while the selecting unit grounds the collector or the drain, so as to reduce a current flowing through the second field-effect transistor, and
wherein the first voltage control unit operates before the selecting unit grounds the collector or the drain, so as to reduce in advance the voltage to be applied to the base of the second transistor or to the gate of the second field-effect transistor.

2. A cascode-connected amplifier circuit, comprising:
a first transistor having a grounded emitter or a first field-effect transistor having a grounded source;
(a) a second transistor, having a grounded base, which is cascode-connected to the first transistor or to the first field-effect transistor, or (b) a second field-effect transistor, having a grounded gate, which is cascode-connected to the first transistor or to the first field-effect transistor; and
a selecting unit causing a collector of the first transistor or a drain of the first field-effect transistor to be grounded,
wherein the selecting unit is controlled so as to (i) become conductive when an input signal reaches a predetermined threshold value and (ii) become nonconductive when the input signal is less than the predetermined threshold value, and
wherein the input signal is detected in accordance with a control voltage by which a gain of the cascode-connected amplifier circuit is controlled.

3. A cascode-connected amplifier circuit, comprising:
a first transistor having a grounded emitter or a first field-effect transistor having a grounded source;
(a) a second transistor, having a grounded base, which is cascode-connected to the first transistor or to the first field-effect transistor, or (b) a second field-effect transistor, having a grounded gate, which is cascode-connected to the first transistor or to the first field-effect transistor;
a selecting unit causing a collector of the first transistor or a drain of the first field-effect transistor to be grounded; and
a second voltage control unit controlling a voltage to be applied to the base of the first transistor or to the gate of the first field-effect transistor, wherein
the selecting unit is controlled in accordance with a voltage to be applied to the base of the first transistor or to the gate of the first field-effect transistor.

4. The cascode-connected amplifier circuit as set forth in claim 3, wherein the selecting unit is controlled so as to (i) become conductive when an input signal reaches a predetermined threshold value and (ii) become nonconductive when the input signal is less than the predetermined threshold value.

5. A cascode-connected amplifier circuit, comprising a plurality of cascode-connected amplifier circuits each recited in claim 3,
(i) a collector of a second transistor in a first cascode-connected amplifier circuit or (ii) a drain of a second field-effect transistor in the first cascode-connected amplifier circuit being connected to (a) a collector of a second transistor in a second cascode-connected amplifier circuit or (b) a drain of a second field-effect transistor in the second cascode-connected amplifier circuit,
(I) a base of a first transistor in the first cascode-connected amplifier circuit or (II) a gate of a first field-effect transistor in the first cascode-connected amplifier circuit being connected to (A) a base of the first transistor in the second cascode-connected amplifier circuit or (B) a gate of the first field-effect transistor in the second cascode-connected amplifier circuit, and
the first and second cascode-connected amplifier circuits being adjacent to each other.

6. The cascode-connected amplifier circuit as set forth in claim 3, wherein the selecting unit is a MEMS switch, a MOS switch, or a CMOS switch.

7. The cascode-connected amplifier circuit as set forth in claim 3, which is incorporated into a semiconductor integrated circuit.

8. The cascode-connected amplifier circuit as set forth in claim 3, which is incorporated into a receiving apparatus.

9. The cascode-connected amplifier circuit as set forth in claim 7, which is incorporated into a receiving apparatus.

10. A cascode-connected amplifier circuit, comprising:
a first transistor having a grounded emitter or a first field-effect transistor having a grounded source;
(a) a second transistor, having a grounded base, which is cascode-connected to the first transistor or to the first field-effect transistor, or (b) a second field-effect transistor, having a grounded gate, which is cascode-connected to the first transistor or to the first field-effect transistor; and
a selecting unit causing a collector of the first transistor or a drain of the first field-effect transistor to be grounded
a first voltage control unit controlling a voltage to be applied to the base of the second transistor or to the gate of the second field-effect transistor, wherein:
the first voltage control unit controls a voltage to be applied to the base of the second transistor while the selecting unit grounds the collector or the drain, so as to reduce a current flowing through the second transistor, or
the first voltage control unit controls a voltage to be applied to the gate of the second field-effect transistor while the selecting unit grounds the collector or the drain, so as to reduce a current flowing through the second field-effect transistor
wherein the selecting unit is controlled in accordance with a voltage to be applied to the base of the second transistor or to the gate of the second field-effect transistor.

11. The cascode-connected amplifier circuit as set forth in claim 10, further comprising:
a first voltage control unit controlling a voltage to be applied to the base of the second transistor or to the gate of the second field-effect transistor, wherein:
the first voltage control unit controls a voltage to be applied to the base of the second transistor while the selecting unit grounds the collector or the drain, so as to reduce a current flowing through the second transistor, or
the first voltage control unit controls a voltage to be applied to the gate of the second field-effect transistor while the selecting unit grounds the collector or the drain, so as to reduce a current flowing through the second field-effect transistor.

12. A cascode-connected amplifier circuit, comprising:
a first transistor having a grounded emitter or a first field-effect transistor having a grounded source;
(a) a second transistor, having a grounded base, which is cascode-connected to the first transistor or to the first field-effect transistor, or (b) a second field-effect transistor, having a grounded gate, which is cascode-connected to the first transistor or to the first field-effect transistor;
a selecting unit causing a collector of the first transistor or a drain of the first field-effect transistor to be grounded;
a plurality of cascode-connected amplifier circuits;
(i) a collector of a second transistor in a first cascode-connected amplifier circuit or (ii) a drain of a second field-effect transistor in the first cascade-connected amplifier circuit being connected to (a) a collector of a second transistor in a second cascode-connected amplifier circuit or (b) a drain of a second field-effect transistor in the second cascode-connected amplifier circuit,
(I) a base of a first transistor in the first cascode-connected amplifier circuit or (II) a gate of a first field-effect transistor in the first cascade-connected amplifier circuit being connected to (A) a base of the first transistor in the second cascode-connected amplifier circuit or (B) a gate of the first field-effect transistor in the second cascode-connected amplifier circuit, and
the first and second cascode-connected amplifier circuits being adjacent to each other,
wherein (i) the base of the first transistor provided in the first cascode-connected amplifier circuit or (ii) the gate of the first field-effect transistor in the first cascode-connected amplifier circuit and (a) the base of the first transistor in the second cascode-connected amplifier circuit or (b) the gate of the first field-effect transistor in the second cascode-connected amplifier circuit are connected to each other via a coupling capacitor.

13. A cascode-connected amplifier circuit, comprising:
a first transistor having a grounded emitter or a first field-effect transistor having a grounded source;
(a) a second transistor, having a grounded base, which is cascode-connected to the first transistor or to the first field-effect transistor, or (b) a second field-effect transistor, having a grounded gate, which is cascode-connected to the first transistor or to the first field-effect transistor;
a selecting unit causing a collector of the first transistor or a drain of the first field-effect transistor to be grounded;
a plurality of cascode-connected amplifier circuits;
(i) a collector of a second transistor in a first cascode-connected amplifier circuit or (ii) a drain of a second field-effect transistor in the first cascade-connected amplifier circuit being connected to (a) a collector of a second transistor in a second cascode-connected amplifier circuit or (b) a drain of a second field-effect transistor in the second cascode-connected amplifier circuit,
(I) a base of a first transistor in the first cascode-connected amplifier circuit or (II) a gate of a first field-effect transistor in the first cascade-connected amplifier circuit being connected to (A) a base of the first transistor in the second cascode-connected amplifier circuit or (B) a gate of the first field-effect transistor in the second cascode-connected amplifier circuit, and
the first and second cascode-connected amplifier circuits being adjacent to each other,
wherein the selecting unit is provided in a cascode-connected amplifier circuit whose gain is higher than a predetermined threshold value.

* * * * *